(12) United States Patent
Bailey et al.

(10) Patent No.: US 7,196,573 B1
(45) Date of Patent: Mar. 27, 2007

(54) SYSTEMS AND METHODS FOR CREATING COMPLEX POLES

(75) Inventors: James A. Bailey, Snowflake, AZ (US); Michael E. Butenhoff, Savage, MN (US); Raymond Chik, Richmond Hill (CA); Angus McLaren, Toronto (CA); William Martin Snelgrove, Toronto (CA)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/346,849

(22) Filed: Feb. 2, 2006

(51) Int. Cl.
 *H03K 5/00* (2006.01)
 *H04B 1/10* (2006.01)

(52) U.S. Cl. .................................... 327/552

(58) Field of Classification Search ........ 327/552–555, 327/311, 313, 323; 323/282; 330/311
See application file for complete search history.

(56) References Cited

U.S. PATENT DOCUMENTS

| | | | |
|---|---|---|---|
| 5,182,477 A | 1/1993 | Yamasaki et al. | |
| 5,418,493 A | 5/1995 | Dijkmans | |
| 5,510,745 A | 4/1996 | Hamano et al. | |
| 5,689,178 A * | 11/1997 | Otake | 323/282 |
| 5,734,297 A | 3/1998 | Huijsing et al. | |
| 5,789,973 A | 8/1998 | Barrett et al. | |
| 5,801,564 A | 9/1998 | Gasparik | |
| 5,929,705 A | 7/1999 | Zhang et al. | |
| 5,936,466 A | 8/1999 | Andoh et al. | |
| 6,111,467 A | 8/2000 | Luo | |
| 6,225,859 B1 * | 5/2001 | Irvine et al. | 327/552 |
| 6,556,081 B2 | 4/2003 | Muza | |
| 6,600,373 B1 | 7/2003 | Bailey et al. | |
| 6,605,993 B2 | 8/2003 | Suzuki | |
| 6,756,841 B2 | 6/2004 | Jaussi et al. | |
| 2005/0151588 A1 | 7/2005 | Bailey et al. | |
| 2006/0132242 A1 * | 6/2006 | Han et al. | 330/311 |

OTHER PUBLICATIONS

Schmid, H.; Moschtz, G.S., "A tunable, video-frequency, low-power, single-amplifier biquadratic filter in CMOS"; Circuits and Systems, 1999. ISCAS '99. Proceedings of the 1999 IEEE International Symposium onvol. 2, 30 May-2.*

Sedra, Adel S. et al. "Optimum Configurations for Single-Amplifier Biquadratic Filters", Dec. 1980, IEEE Trans. on Cir. and Sys., vol. CAS-27, No. 12, pp. 1155-1163.

* cited by examiner

*Primary Examiner*—Vu Le
*Assistant Examiner*—Diana Cheng
(74) *Attorney, Agent, or Firm*—Hamilton, DeSanctis & Cha LLP (57) ABSTRACT

Various devices, circuits and systems including filter sections for creating complex poles are described herein. For example, various circuits including transistors, tuning capacitors and resistors are described. In the circuits, the tuning capacitor is electrically coupled between the gate and source of the transistor, and the resistor is electrically coupled to the gate of the transistor. In one configuration, the circuit input is applied to the gate of the transistor via the resistor, and the output is taken from the source of the transistor. In another configuration, the input is applied to the source of the transistor, and the output is taken from the same source. In yet another configuration, the input is applied at the source of the transistor and the output is taken from the drain of the transistor.

20 Claims, 9 Drawing Sheets

SYSTEMS AND METHODS FOR CREATING COMPLEX POLES

BACKGROUND OF THE INVENTION

The present invention is related to systems and methods for electrical signal processing, and in particular to systems and methods for filtering electrical signals.

Figure 1:
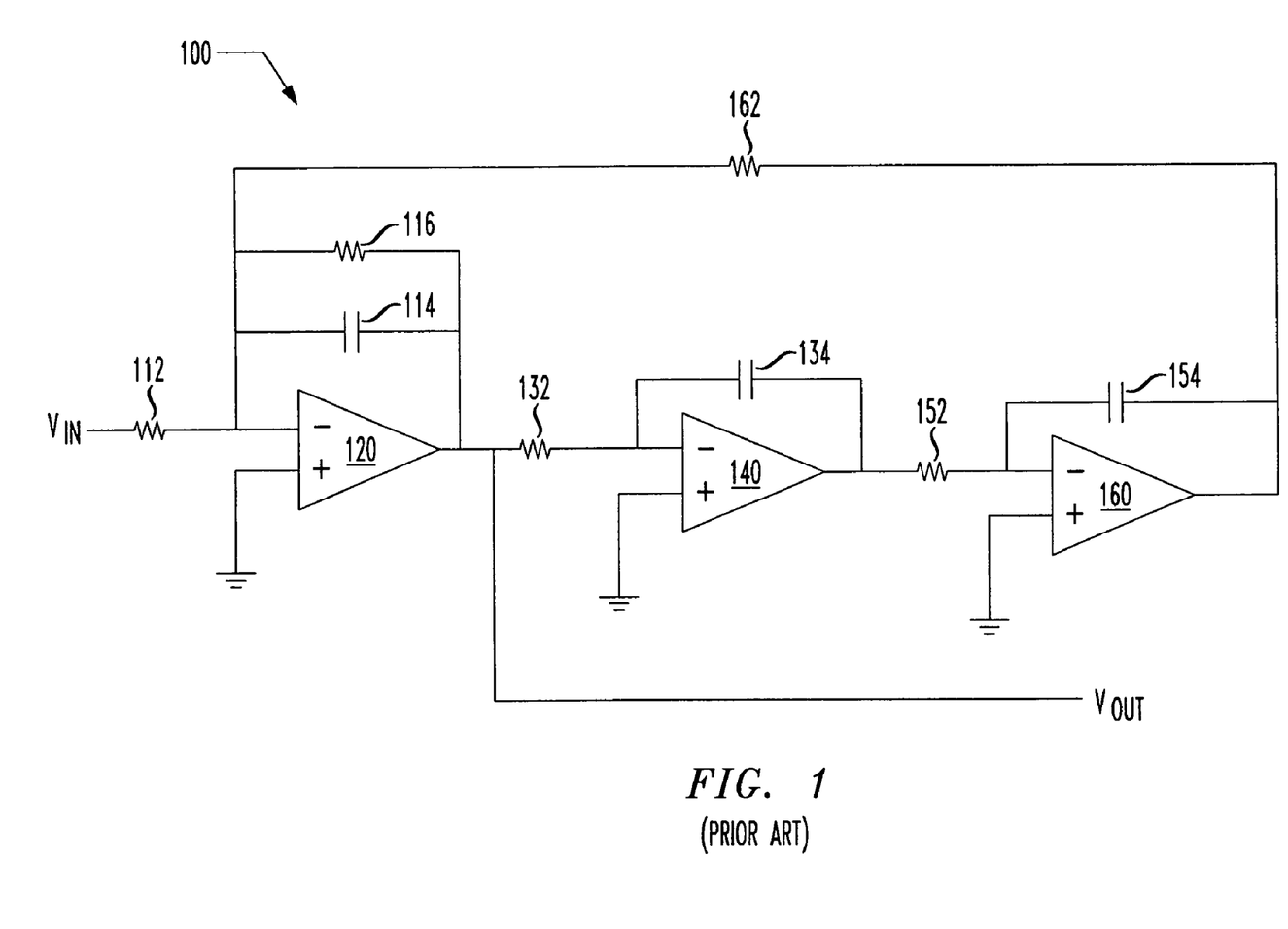
FIG. 1 depicts a known Tow-Thomas Biquadratic Filter.

A variety of electrical signal filters and approaches for electrical signal filtering have been proposed and developed. For example, a known Tow-Thomas biquadratic filter 100 is depicted in FIG. 1. Filter 100 includes a lossy integrator, an inverting integrator and an inverting amplifier. The lossy integrator comprises an operational amplifier 120, a capacitor 114, and resistors 112, 116. This lossy integrator is used to achieve either low-pass or band-pass frequency states. The inverting integrator is formed of an operational amplifier 140, a resistor 132, and a capacitor 134. The inverting amplifier is formed of an operational amplifier 160 with resistors 152, 154 defining the gain. The inverting amplifier provides a low-noise pre-amplification for the entire circuit. The lossy integrator is coupled to the inverting amplifier via a feedback loop including a resistor 162. As shown, filter 100 provides a pair of complex poles, but requires three amplifiers to do so. In some cases, the inverting amplifier can be eliminated where the inverting integrator is modified to compensate. In this case, the filter requires one less amplifier to create a pair of complex poles. While the aforementioned circuits are capable of creating pairs of complex poles, the number of required amplifiers requires substantial die area and power consumption. Further, the preceding circuits utilize operational amplifiers which require more circuitry than other types of amplifiers.

Hence, for at least the aforementioned reasons, there exists a need in the art for advanced circuits and methods for creating complex pole pairs with reduced circuitry.

BRIEF SUMMARY OF THE INVENTION

The present invention is related to systems and methods for electrical signal processing, and in particular to systems and methods for filtering electrical signals.

Various embodiments of the present invention provide tunable circuits operable to create one or more pairs of complex poles. Such embodiments include a transistor, a tuning capacitor and a resistor. The tuning capacitor is electrically coupled between the gate and source of the transistor, and the resistor is electrically coupled to the gate of the transistor. In one configuration of such embodiments, the circuit input is applied to the gate of the transistor via the resistor, and the output is taken from the source of the transistor. In other configurations, the input is applied to the source of the transistor, and the output is taken from the same source. In yet other configurations, the input is applied at the source of the transistor and the output is taken from the drain of the transistor. The tunable circuits further include another tuning capacitor electrically coupled to the source of the transistor.

In some embodiments of the present invention, the tunable circuits are formed as differential circuits. Such differential circuits include a pair of transistors, a pair of tuning capacitors, and a pair of resistors arranged as a pair of transistor, tuning capacitor and resistor sets. Each of the transistor, capacitor and resistor sets is implemented by electrically coupling the tuning capacitor between the gate and source of the transistor, and electrically coupling the resistor to the gate of the transistor. In some configurations, a differential circuit input is applied across the gates of the transistors via the resistors, and the output is taken across the sources of the transistors. In other configurations, the differential input is applied across the sources of the transistors, and the differential output is taken across the same sources. In yet other configurations, the differential input is applied across the sources of the transistors and the differential output is taken across the drains of the transistors. In some cases, another capacitor is electrically coupled between the sources of the transistors, while in other cases, two additional capacitors are electrically coupled between respective sources of the transistors and a ground. In particular cases, a capacitively cross-connected input is provided with a capacitor electrically coupled between an input end of one of the resistors and the output end of the other resistor, and another capacitor electrically coupled between an input end of the other capacitor and the output end of the first capacitor.

In various cases, the previously discussed transistors are referred to as filter transistors because they are incorporated into a filter section or stage of the circuit. In such cases, the differential circuit may further include common gate transistors, load stage transistors and/or differential input transistors. The common gate transistors are referred to as such because they form part of a common gate section or stage of the circuit, the load stage transistors are referred to because they form part of a load section or stage of the circuit, and the differential transistors are referred to as such because they form part of a differential input section of the circuit. As a particular example, some instances of the differential circuit may include a pair of common gate transistors where the drain of each of the common gate transistors is electrically coupled to a power source, and the sources of each of the common gate transistors is electrically coupled to respective drains of the filter transistors. As another particular example, the differential circuit may further include a pair of differential input transistors with a differential input applied across the gates thereof. The respective drains of the differential input transistors are electrically coupled to the sources of the filter transistors, and the sources of the differential input transistors are electrically coupled to a current source.

In various instances of the embodiments, the differential circuits further include a nullator electrically coupled across the source of the transistors. In such instances, the differential output of the circuit may be taken across the sources of the transistors and the differential input applied across the gates of the transistors via the resistors. In an exemplary instance, the nullator includes two transistors with the drain of each of the transistors electrically coupled to the gate of the other transistor, and the drains of the transistors of the nullator electrically coupled to respective sources of the aforementioned filter transistors.

Yet other embodiments of the present invention provide cascoded filters. Such cascoded filters include two or more filter stages each formed of filter transistor pairs, and each capable of creating a pair of complex poles. In one particular case, a differential input stage is electrically coupled to one of the filter stages, and the filter stages are electrically coupled via a bias stage.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 6 shows yet another filter in accordance with one or more embodiments of the present invention that uses the filter section shown in FIG. 3a; and FIG. 7 depicts a cascoded filter in accordance with some embodiments of the present invention that includes two of the filter sections shown in FIG. 3a.

DETAILED DESCRIPTION OF THE INVENTION

The present invention is related to systems and methods for electrical signal processing, and in particular to systems and methods for filtering electrical signals.

Various embodiments of the present invention provide circuits operable to create one or more pairs of complex poles. These circuits may be single-ended or differential circuits. The singe-ended circuits include a transistor, a tuning capacitor and a resistor; with the tuning capacitor electrically coupled between the gate and source of the transistor, and the resistor electrically coupled to the gate of the transistor. As used herein, the term "transistor" is used in its broadest sense to mean any type of transistor. Thus, while the embodiments of the present invention are discussed in relation to particular MOSFET devices, one of ordinary skill in the art will recognize that other circuits consistent with embodiments of the present invention may be implemented using other types of transistors. For example, p-type transistors can be implemented using n-type devices, and vice versa. Further, one or more of the embodiments may be implemented using a different semiconductor technology such as, for example, bipolar technology. Based on the disclosure provided herein, one of ordinary skill in the art will recognize a variety of different implementations that are possible and use various types of transistors.

It should be noted that in some cases transistors are referred to herein as "filter transistors", "common gate transistors", "load stage transistors", or "differential input transistors". The aforementioned designations imply a circuit stage in which the transistor is incorporated, rather than a type or operational characteristic of the given transistor. Thus, as an example, a filter transistor may be included in a circuit portion that provides, among other things, a filter function. In contrast, a differential input transistor may be included in a circuit stage that provides, among other things, a differential input function. Based on the disclosure provided herein, one of ordinary skill in the art will recognize that a filter transistor, a common gate transistor, a load stage transistor, or a differential input transistor may be equivalent in all aspects to other transistors, or they may differ in some aspects depending upon particular design considerations.

As used herein, the term "capacitor" is used in its broadest sense to mean any device capable of introducing capacitance to an electrical circuit. Thus, for example, a capacitor may be a discrete element apart from any semiconductor device, a discrete element formed on a semiconductor die along with transistors, or a transistor that inherently includes capacitance such as, for example, gate-drain capacitance. As used herein, the term "tuning capacitor" implies a discrete capacitor apart from any capacitor inherent in a transistor. Thus, where a circuit includes a transistor and a tuning capacitor, the circuit includes the capacitance inherent in the transistor along with the capacitance offered by the tuning capacitor. Similarly, as used herein, the term "resistor" is used in its broadest sense to mean any device capable of introducing resistance to an electrical circuit. Thus, for example, a resistor may be a passive element apart from any semiconductor device, a passive element formed on a semiconductor device, or an active element(s) configured to operate as a load.

Also, as used herein, the phrase "electrically coupled" is used in its broadest sense to mean any connection whereby an electrical signal may be translated from one element to another. Thus, for example, two elements are electrically coupled where they are connected by a conductive wire. As another example, two devices are electrically coupled where they are connected via a resistor, capacitor, transistor, optocoupler, or other device capable of transferring an electrical signal or derivative thereof. Based on the disclosure provided herein one of ordinary skill in the art will recognize a variety of methods that may be used to electrically couple elements, and/or devices that may form part of an electrical coupling. In contrast, the phrase "electrically connected" implies that two elements are attached by a wire or metal layer.

Figure 2:
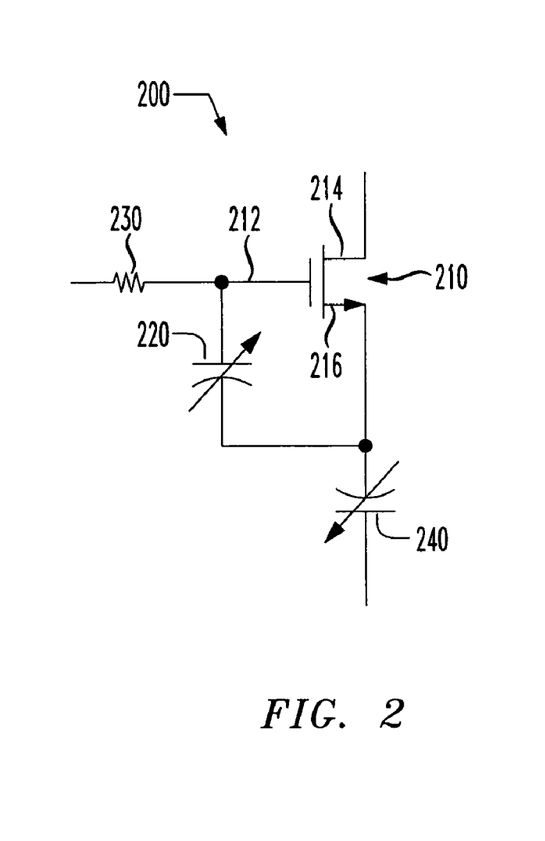
FIG. 2 depicts a single transistor filter section in accordance with various embodiments of the present invention.

Turning to FIG. 2, a filter section 200 in accordance with various embodiments of the present invention is illustrated. Filter section 200 includes a transistor 210 with a gate 212, a drain 214 and a source 216. In addition, filter section 200 includes, a resistor 230, a tuning capacitor 220, and another capacitor 240. One node of resistor 230 is connected to gate 212 of transistor 210, and the other node of resistor 230 is connected to an input signal, bias voltage, and/or other circuit elements (not shown). Tuning capacitor 220 is connected between gate 212 of transistor 210 and source 216 of transistor 210. One node of capacitor 240 is connected to source 216 of transistor 210, and the other node is connected to a ground or other circuit elements (not shown). Drain 214 of transistor 210 is connected to other circuit elements (not shown). In one particular case, drain 214 of transistor 210 is connected to a power source.

Filter section 200 provides a basic filter building block operable to create a pair of complex poles with an adjustable cutoff frequency ($\omega_0$) and Q-factor (Q). The cutoff frequency is described by the following equation found using a small signal model for transistor 210:

$$\omega_0 = \sqrt{\frac{g_m}{R_p C_p C_q}},$$

where $g_m$ is the transconductance of transistor 210, $R_p$ is the resistance of resistor 230, $C_p$ is the sum of the capacitance of capacitor 240 and all other parasitic capacitances between the source terminal and AC ground, and $C_q$ is the sum of the capacitance of tuning capacitor 220 the gate-source capacitance ($C_{gs}$) of transistor 210. Using the same variables and a small signal model for transistor 210, the Q-factor of filter section 210 is described by the following equation:

$$Q = \frac{\sqrt{g_m R_p C_p C_q}}{C_p + C_q}.$$

Based on the disclosure provided herein, one of ordinary skill in the art will recognize that tuning capacitor 220 offers an ability to tune both the cutoff frequency and the Q-factor of a filter designed using filter section 200. Further, filter section 200 may be tuned by adjusting both tuning capacitor 220 and capacitor 240, or just capacitor 240. This tunability offers increased design flexibility in comparison to other known filter designs. As just one example, the Tow-Thomas biquadratic filter described in FIG. 1 typically requires an amplifier bandwidth many times larger than the desired filter cutoff frequency to achieve an accurate Q-factor. In contrast, a filter designed using filter section 200 is not necessarily limited by such a constraint. Based on the disclosure provided herein, one of ordinary skill in the art will recognize a variety of other advantages that may be achieved through the use of filter section 200.

Filter section 200 may be configured in a variety of ways depending upon particular design constraints. For example, filter section 200 can be connected in a source follower configuration with the input applied to gate 212 of transistor 210, and the output taken from source 216 of transistor 210. In this case, a parasitic zero exists at a frequency defined by the following equation:

$$\omega_z = \frac{g_m}{C_q}.$$

Where it is desirable to eliminate or modify the parasitic zero, the input of filter section 200 may be applied to source 216 of transistor 210, and the output of filter section 200 is taken from drain 214 of transistor 210. Alternatively, filter section 200 may be configured such that the input is applied to source 216 of transistor 210, and the output is taken from the same source 216. In some cases, resistor 230 is electrically coupled to a voltage source and acts as a load. Signal currents from a previous stage are fed into the source 216 of transistor 210, and the output is taken as the voltage at source 216 of transistor 210.

Figure 3A:
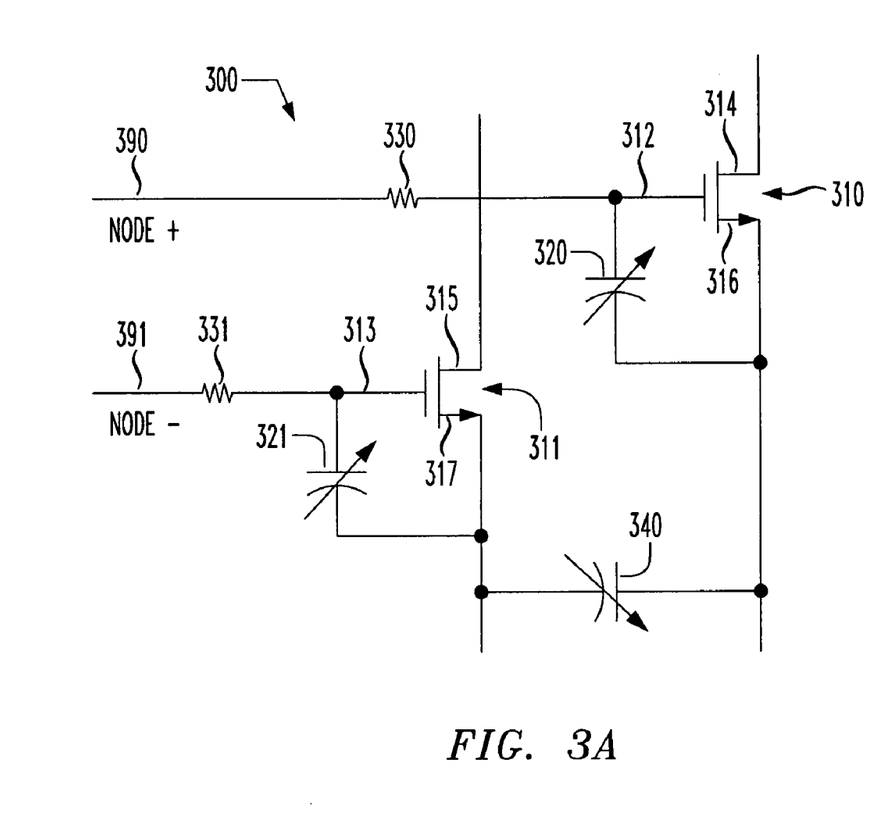
FIG. 3a depicts a differential filter section in accordance with some embodiments of the present invention.

Turning to FIG. 3a, a differential filter section 300 in accordance with one or more embodiments of the present invention is shown. Filter section 300 is substantially a combination of two filter sections 200 combined as a differential pair. In particular, filter section 300 includes two transistors 310, 311. Transistor 310 includes a gate 312, a drain 314 and a source 316; and transistor 311 includes a gate 313, a drain 315 and a source 317. Filter section 300 further includes a positive node (NODE+) 390 electrically coupled to gate 312 of transistor 310 via a resistor 330, and a negative node (NODE−) 391 electrically coupled to gate 313 of transistor 311 via a resistor 331. A tuning capacitor 320 is connected between gate 312 of transistor 310 and source 316 of transistor 310, and another tuning capacitor 321 is connected between gate 313 of transistor 311 and source 317 of transistor 311. A capacitor 340 is connected differentially between source 316 of transistor 310 and source 317 of transistor 311.

In some cases, the corresponding differential elements are substantially the same. Thus, resistor 330 is substantially the same as resistor 331, transistor 310 is substantially the same as transistor 311, and capacitor 320 is substantially the same as capacitor 321. In such cases, the operation of differential filter section 300 may be described by the same cutoff frequency and Q-factor equations set forth in relation to filter section 200. In this situation, $g_m$ is the transconductance value of either transistor 310 or transistor 311, $R_p$ is the resistance value of either resistor 330 or resistor 331, $C_p$ is the sum of the capacitance of capacitor 340 and all other parasitic capacitances between the source terminal and AC ground, and $C_q$ is the sum of the capacitance of either capacitor 320 or capacitor 321, and the gate-source capacitance ($C_{gs}$) of either transistor 330 or transistor 331.

Based on the disclosure provided herein, one of ordinary skill in the art will recognize that capacitors 320, 321 and 340 offer an ability to tune both the cutoff frequency and the Q-factor of a filter designed using filter section 300. As with filter section 200, this tunability provides one or more advantages when compared with other filters known in the art.

Similar to filter section 200, filter section 300 may be configured in a variety of ways depending upon particular design constraints. For example, where it is desirable to eliminate the parasitic zero typical in many filters, the input of filter section 300 is applied differentially between source 316 of transistor 310 and source 317 of transistor 311, and the differential output of filter section 300 is taken differentially from drain 314 of transistor 310 and drain 315 of transistor 311. Alternatively, filter section 300 may be connected such that the differential input is applied to gate 312 via resistor 330 and gate 313 via resistor 331, and the differential output is taken differentially from source 316 of transistor 310 and source 317 of transistor 311; or such that the input is applied differentially across the sources of transistors 310, 311, and the output is taken differentially from the same sources. In some cases, resistor 330 and resistor 331 are tied between a voltage reference and the respective gates of transistor 310 and transistor 311, and the entire sub circuit or stage is used as a load. Signal currents from a previous stage are fed into the sources of transistor 310 and transistor 311, and the differential output is taken as the voltage between the source 316 of transistor 310 and source 317 of transistor 311. Various filters using filter section 300 are provided in relation to FIGS. 5 through 7 below.

Figure 3B:
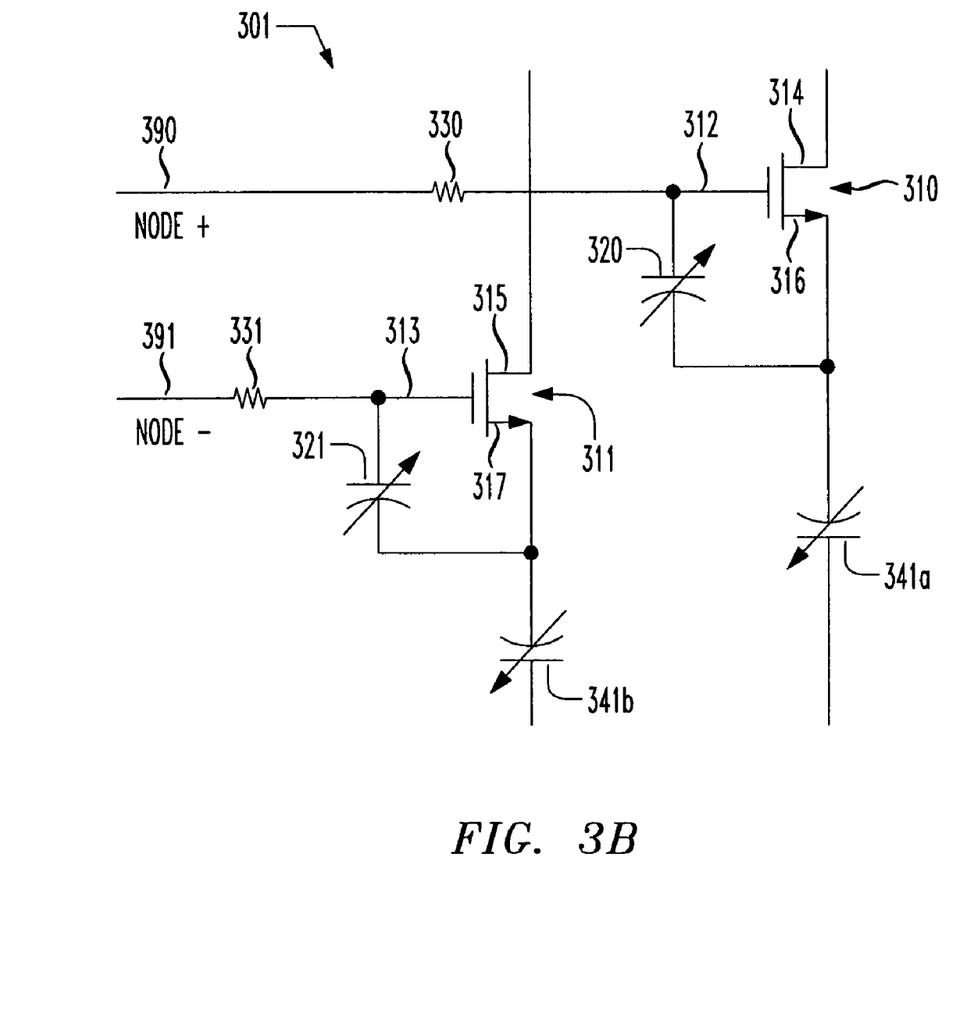
FIG. 3b shows an alternative differential filter section in accordance with other embodiments of the present invention.

Turning to FIG. 3b, another differential filter section 301 in accordance with other embodiments of the present invention is shown. Differential filter section 301 is similar to differential filter section 300 with the exception that differentially connected capacitor 340 is replaced by two single ended capacitors 341 each coupled between a respective transistor source and ground. Based on the disclosure provided herein, one of ordinary skill in the art will note that capacitors 341 may alternatively be coupled between the respective sources and a signal source, or to each other to achieve different operational characteristics. For example, coupling capacitors 341 between the respective sources and a signal source may be done to create a high pass filter by adding a zero. The operation of differential filter segment 301 is similar to that described in relation to differential filter segment 300, except that $C_p$ in the aforementioned equations is the series combination of the capacitance of both capacitors 341 and all other parasitic capacitances between the source terminal and AC ground. It should noted that while not shown, other embodiments of the present invention may replace capacitor 340 and capacitors 341 with a combination of single-ended and differential capacitors. A filter using filter section 301 is provided in relation to FIG. 4 below. It should be noted that in most circumstances, filter section 300 may be used in place of filter section 301, and vice versa.

Figure 3C:
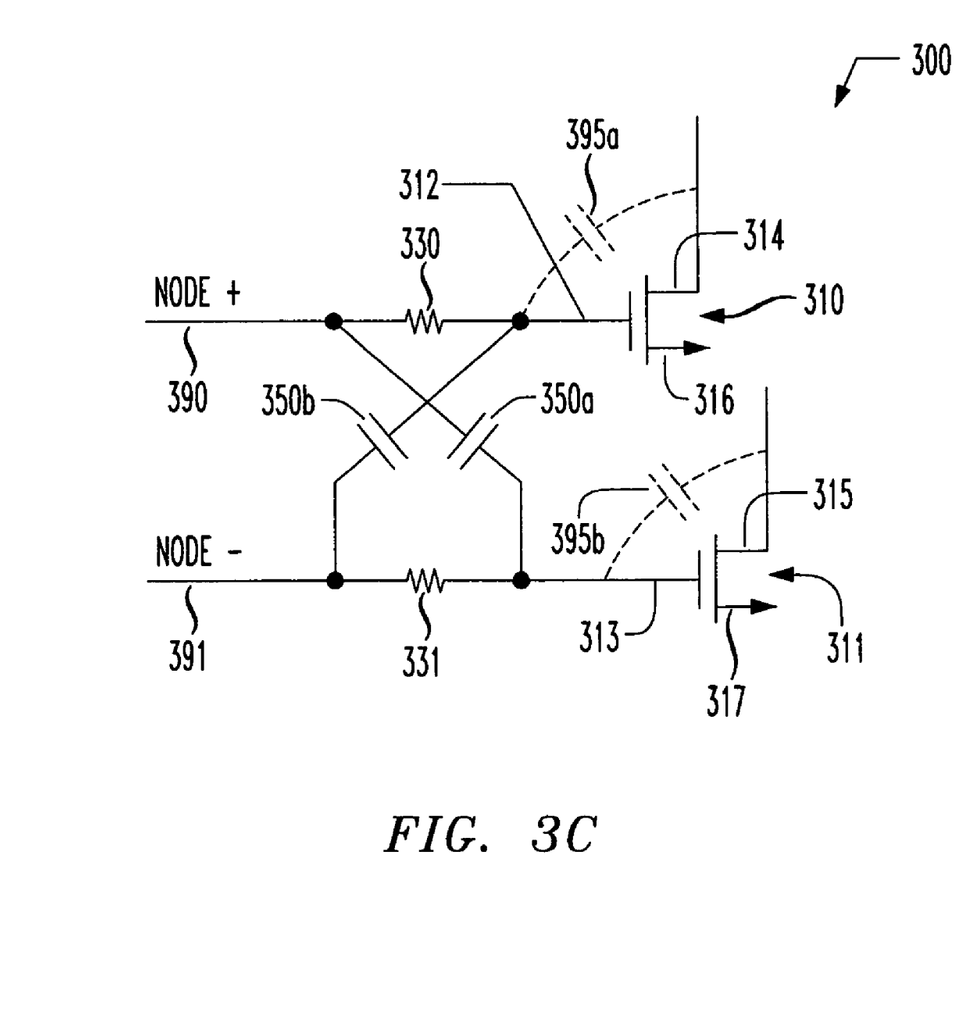
FIG. 3c depicts an approach for reducing the impact of gate-drain capacitance that may be used in relation to one or more embodiments of the present invention.

To this point, circuit operation has ignored the impact of gate-drain capacitance as well as any parasitic capacitance for simplicity. However, depending upon design requirements, such capacitances may be significant. Thus, some embodiments of the present invention may utilize one or more design modifications that operate to reduce or eliminate the effect of such capacitances on Q. Turning to FIG. 3c, one design modification is discussed in relation to differential filter section 300. In particular, cross-connected capacitors 350 are added to reduce or eliminate the effect of gate-drain capacitance inherent in respective transistors 310, 311. This gate-drain capacitance is depicted as capacitors 395 drawn with dashed lines to suggest that the capacitance is part of the respective transistors.

Figure 4A:
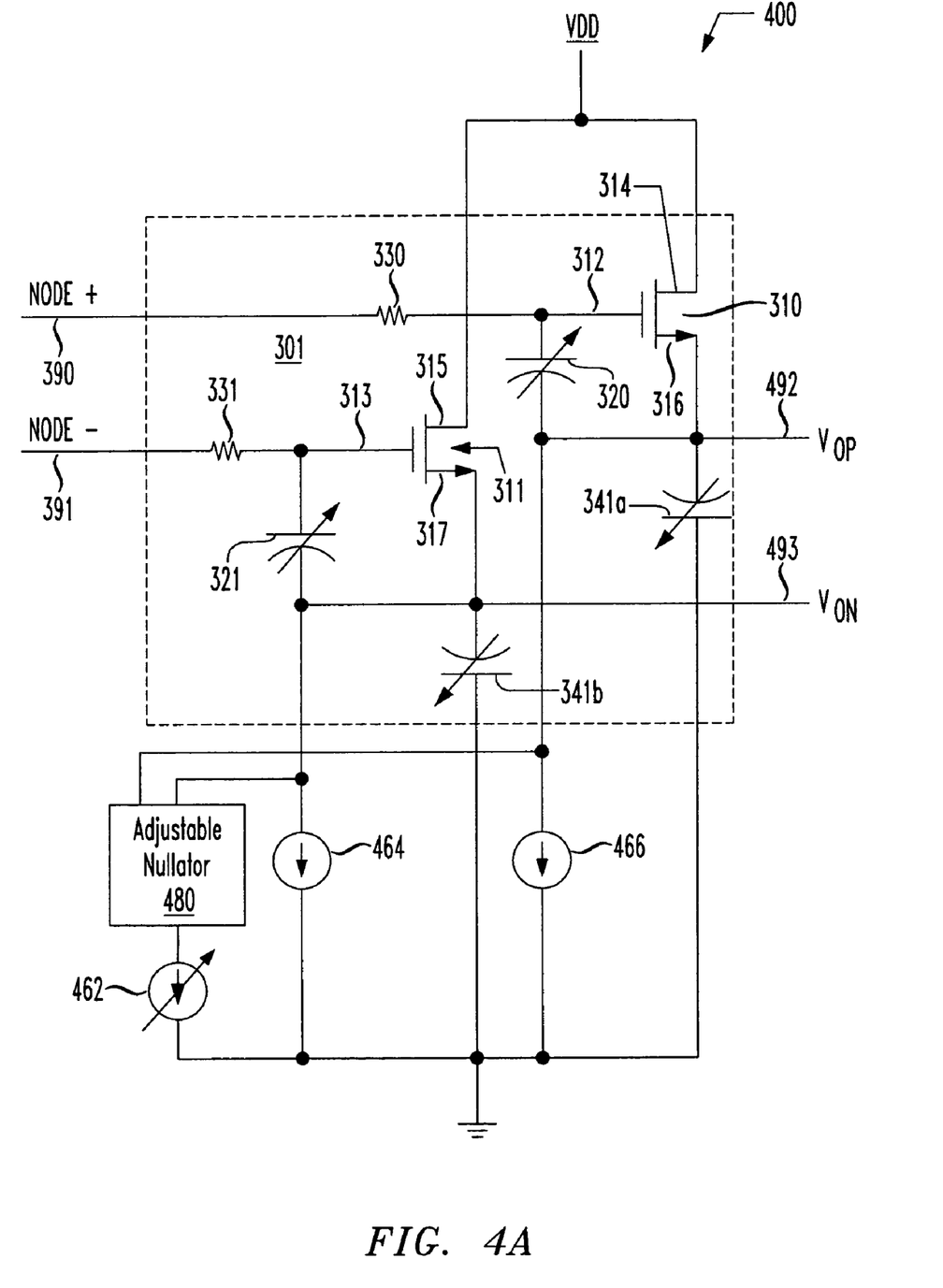
FIGS. 4a–4b depict a filter in accordance with some embodiments of the present invention that utilizes the differential filter section depicted in FIG. 3b.

Turning to FIG. 4, another approach for reducing or eliminating the effects of gate-drain capacitance and parasitic capacitance at the gate on Q is discussed. In particular, FIG. 4a depicts a filter circuit 400 that includes a differential filter section 301 with an adjustable nullator 480 differentially connected between source 316 of transistor 310 and source 317 of transistor 311. Nullator 480 may be any circuit that may be adjusted to increase the voltage gain of differential filter section 301 (or differential filter section 300) to compensate for the attenuation created by the capacitor divider consisting of capacitors 320, 321 and the parasitic capacitance at gates 312, 313 of transistors 310, 311.

In addition, filter circuit 400 includes fixed current sources 464, 466 that are electrically coupled between respective sources 317, 316 of transistors 311, 310, and in parallel to capacitors 341. Further, an adjustable current source 462 is electrically coupled between adjustable nullator 480 and ground. Filter circuit 400 provides a differential output with the positive output (VOP) taken from source 316 of transistor 310, and the negative output (VON) taken from source 317 of transistor 311. A differential input is applied between NODE+ 390 and NODE− 391.

Figure 4B:
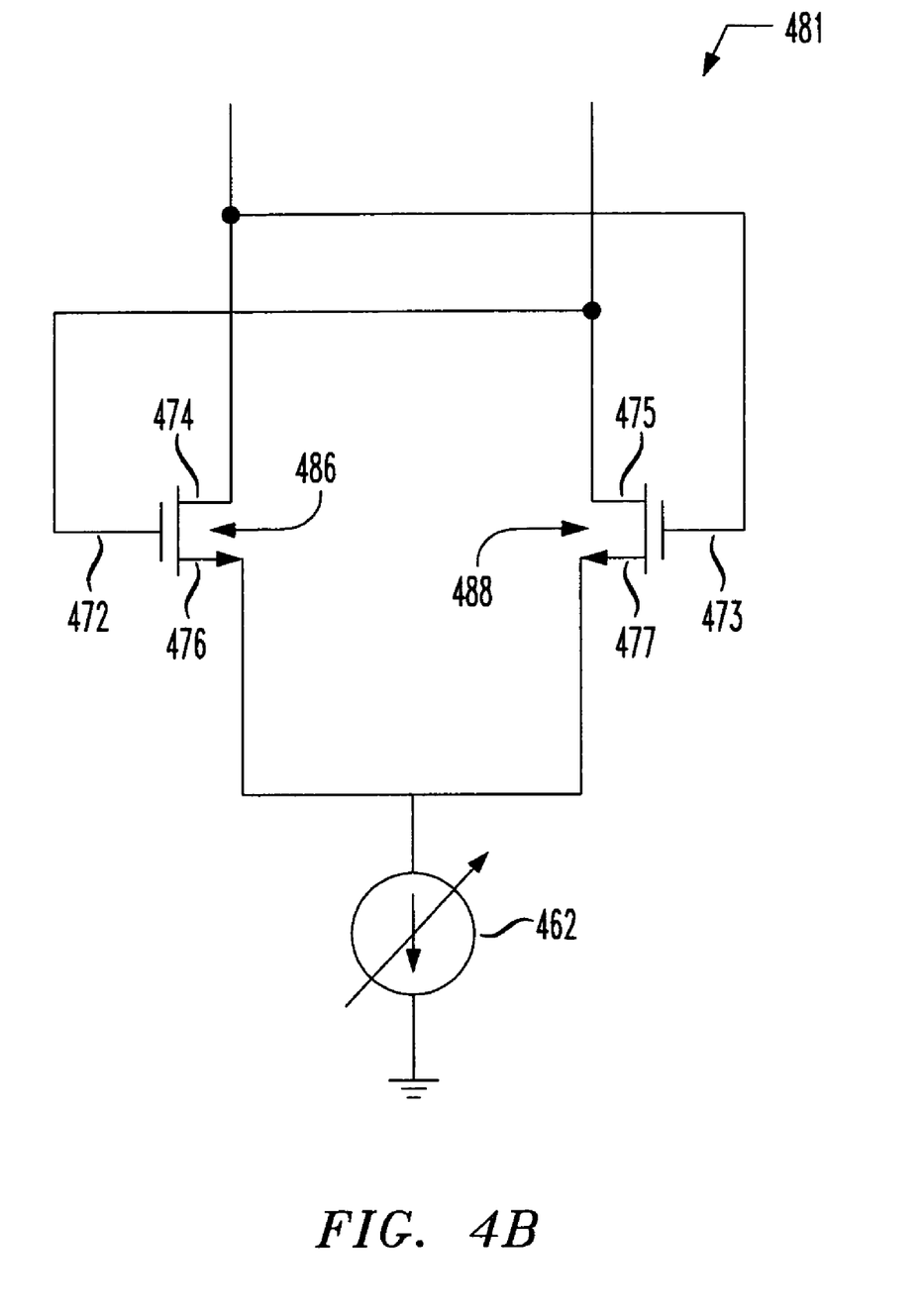

Turning to FIG. 4b, an exemplary nullator 481 that may be used in accordance with one or more embodiments of the present invention is illustrated. Nullator 481 includes a transistor 486 with a gate 472, a drain 474 and a source 476; and a transistor 488 with a gate 473, a drain 475 and a source 477. Gate 472 of transistor 486 is connected to drain 475 of transistor 488, and gate 473 of transistor 488 is connected to drain 474 of transistor 486. Further, source 476 of transistor 486 and source 477 of transistor 488 are each connected to variable current source 462. Nullator 481 may be incorporated into filter circuit 400 in place of nullator 480 by connecting drain 474 of transistor 486 to source 316 of transistor 310, and connecting drain 475 of transistor 488 to source 317 of transistor 311.

Figure 5:
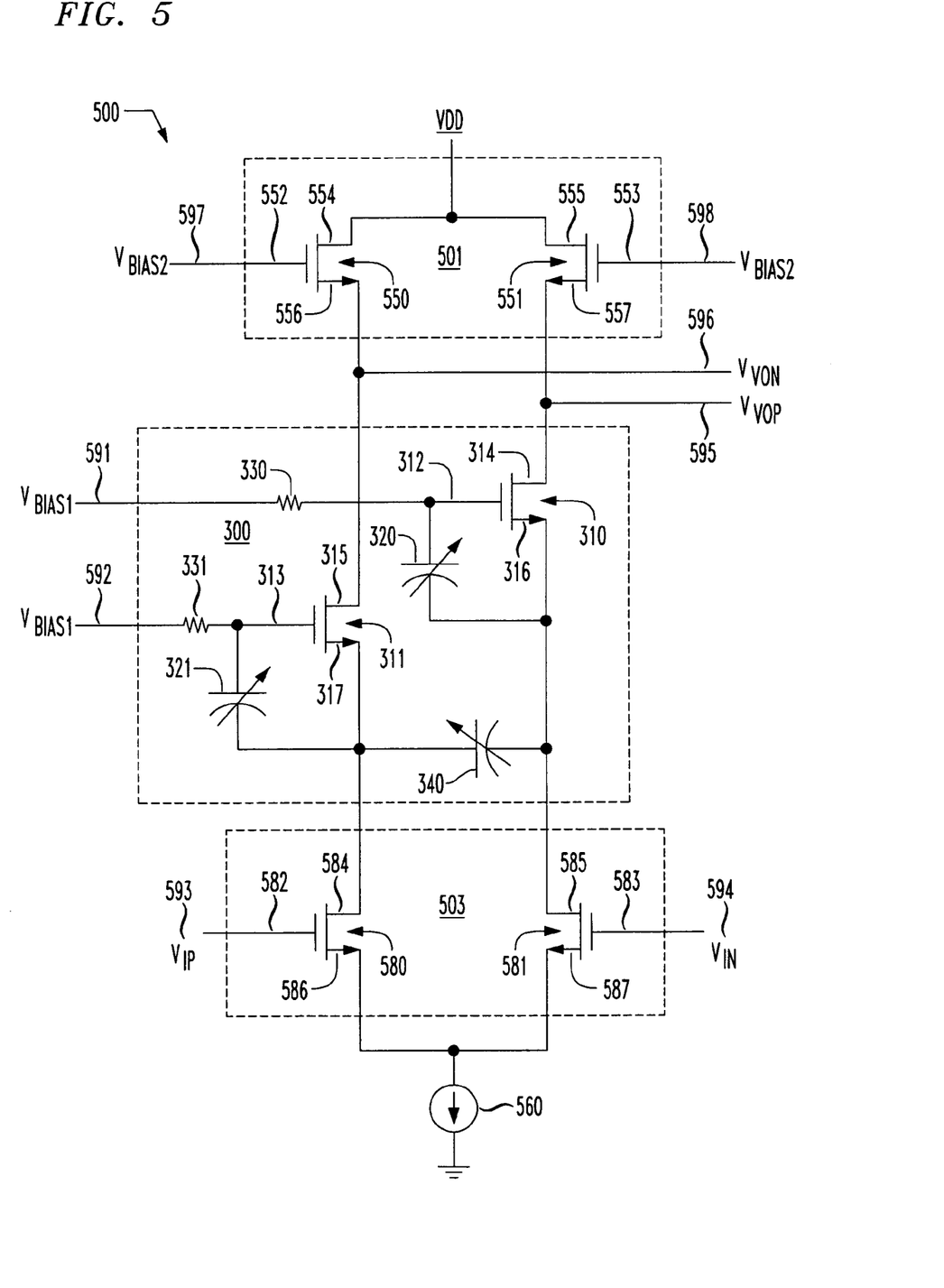
FIG. 5 depicts another filter in accordance with various embodiments of the present invention that uses the filter section shown in FIG. 3a and eliminates a parasitic zero.

Turning to FIG. 5, a filter 500 including a differential filter section 300 in accordance with various embodiments of the present invention is depicted. In particular, filter 500 is an exemplary filter where the input signal is applied differentially across the sources of the transistors in differential filter section 300 using a voltage-to-current converter. The differential output is taken across the drains of the transistors in differential filter section 300.

In particular, filter 500 includes an load stage 501 electrically coupled to filter section 300, and a differential input section 503 (i.e., a voltage-to-current converter) electrically coupled to differential filter stage 300. Load stage 501 includes a transistor 550 with a gate 552, a drain 554 and a source 556; and a transistor 551 with a gate 553, a drain 555 and a source 557. A differential filter output is provided that includes a positive output (VOP) 595 and a negative output (VON) 596 coupled to source 557 and source 556, respectively. Differential bias inputs 597, 598 are connected to respective gates 552, 553 of transistors 550, 551. In operation, load stage 501 operates to provide a load impedance on differential outputs 595, 596 resulting in a current to voltage conversion.

The inputs of differential filter section 300 are driven by a bias voltage. In particular, gate 512 of transistor 510 is driven by a bias voltage 591 via resistor 330, and gate 513 of transistor 511 is driven by a bias voltage 592 via resistor 331. Bias voltage 591 and bias voltage 592 are typically set at the same level. Differential input stage 503 (i.e., voltage-to-current converter) includes a transistor 580 with a gate 582, a drain 584 and a source 586; and a transistor 581 with a gate 583, a drain 585 and a source 587. Gate 582 of transistor 580 and gate 583 of transistor 581 are connected to respective differential inputs 593, 594. Source 586 of transistor 580 and source 587 of transistor 581 are each electrically coupled to a bias current source 560. It should be noted that other voltage-to-current converters may be used in place of differential input stage 503 including, but not limited to, a folded cascode preceded by a differential pair.

Load stage 501 is electrically coupled to differential filter section 300 by connecting source 556 of transistor 550 to drain 315 of transistor 311, and connecting source 557 of transistor 551 to drain 314 of transistor 310. Further, differential input stage 503 is electrically coupled to differential filter stage 300 by connecting drain 584 of transistor 580 to source 317 of transistor 311, and connecting drain 585 of transistor 581 to source 316 of transistor 310. At this juncture, it should be noted that differential filter section 301 may be used in place of differential filter section 300 to achieve substantially the same circuit operation.

Figure 6:
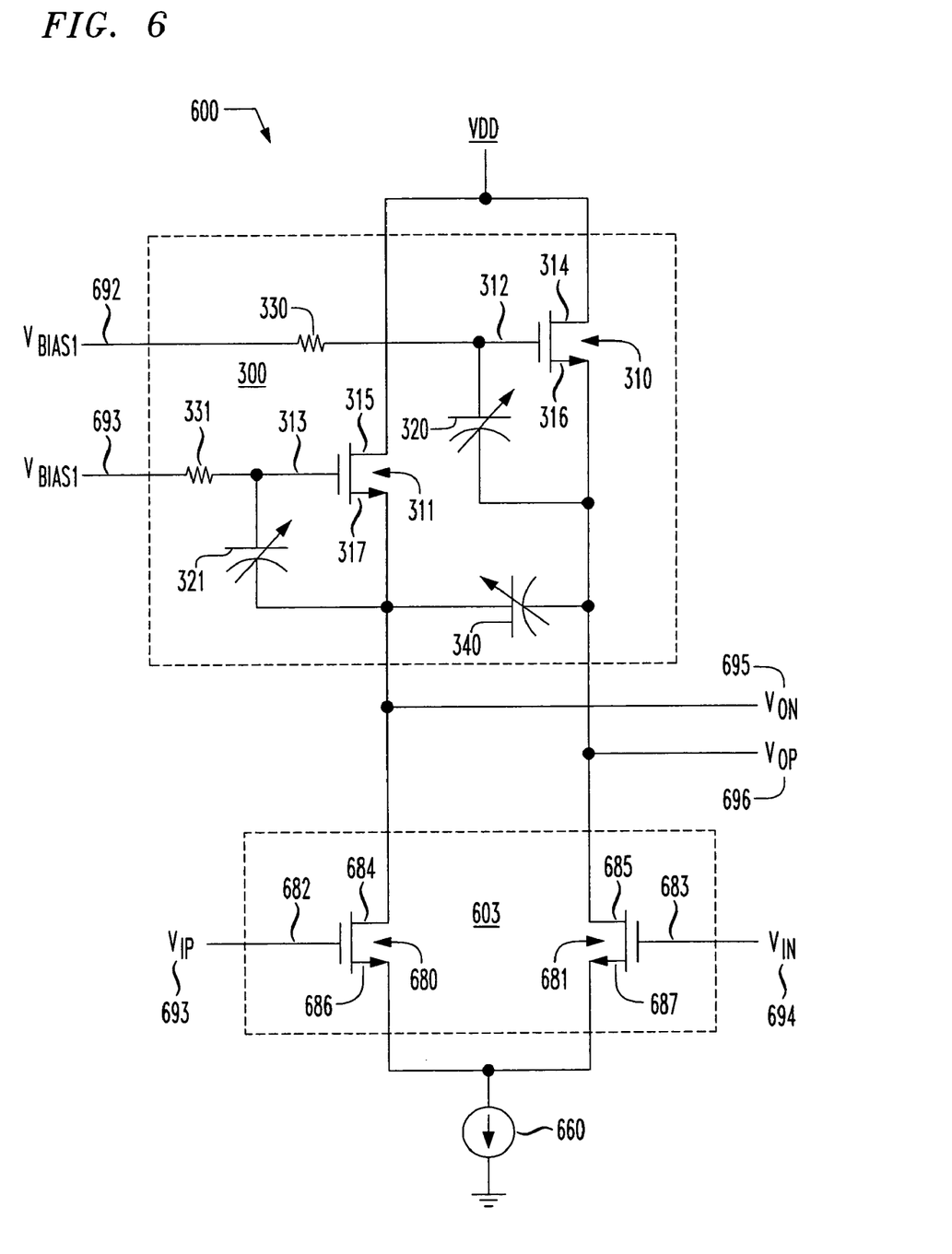

Turning to FIG. 6, a filter 600 including a differential filter section 300 in accordance with some embodiments of the present invention is depicted. In particular, filter 600 is exemplary of filters in accordance with the present invention where the input signal is applied differentially across the sources of the transistors in differential filter section 300 using a voltage-to-current converter, and the output is taken differentially across the same sources.

Filter 600 includes a differential input stage 603 electrically coupled to filter section 300. Differential input stage 603 includes a transistor 680 with a gate 682, a drain 684 and a source 686; and a transistor 681 with a gate 683, a drain 685 and a source 687. A differential filter output is provided, and includes a positive output (VOP) 696 and a negative output (VON) 695 coupled to source 687 and source 686, respectively. A positive differential input (VIP) 693 is electrically coupled to gate 682 of transistor 680, and a negative differential input (VIN) 694 is electrically coupled to gate 683 of transistor 681.

Differential input stage 603 is electrically coupled to differential filter section 300 by connecting drain 684 of transistor 680 to source 317 of transistor 311, and connecting drain 685 of transistor 681 to source 316 of transistor 310. A differential bias input 692 is applied to gate 312 of transistor 310 via resistor 330, and another differential bias input 693 is applied to gate 313 of transistor 311.

In filter 600 where the differential input is applied across source 317 of transistor 311 and source 316 of transistor 310 and the differential output is taken across the same sources, a parasitic zero exists at a frequency defined by the following equation:

$$\omega_z = \frac{1}{R_p C_q}.$$

Where it is desired to eliminate the parasitic zero, the differential output can be taken across drain 315 of transistor 311 and drain 314 of transistor 310 where an additional load stage is added similar to that shown in FIG. 5. Alternatively, components can be chosen to place the parasitic zero at a relatively high frequency, and thus render the effect of the parasitic zero on the frequency response of filter 600 inconsequential.

Figure 7:
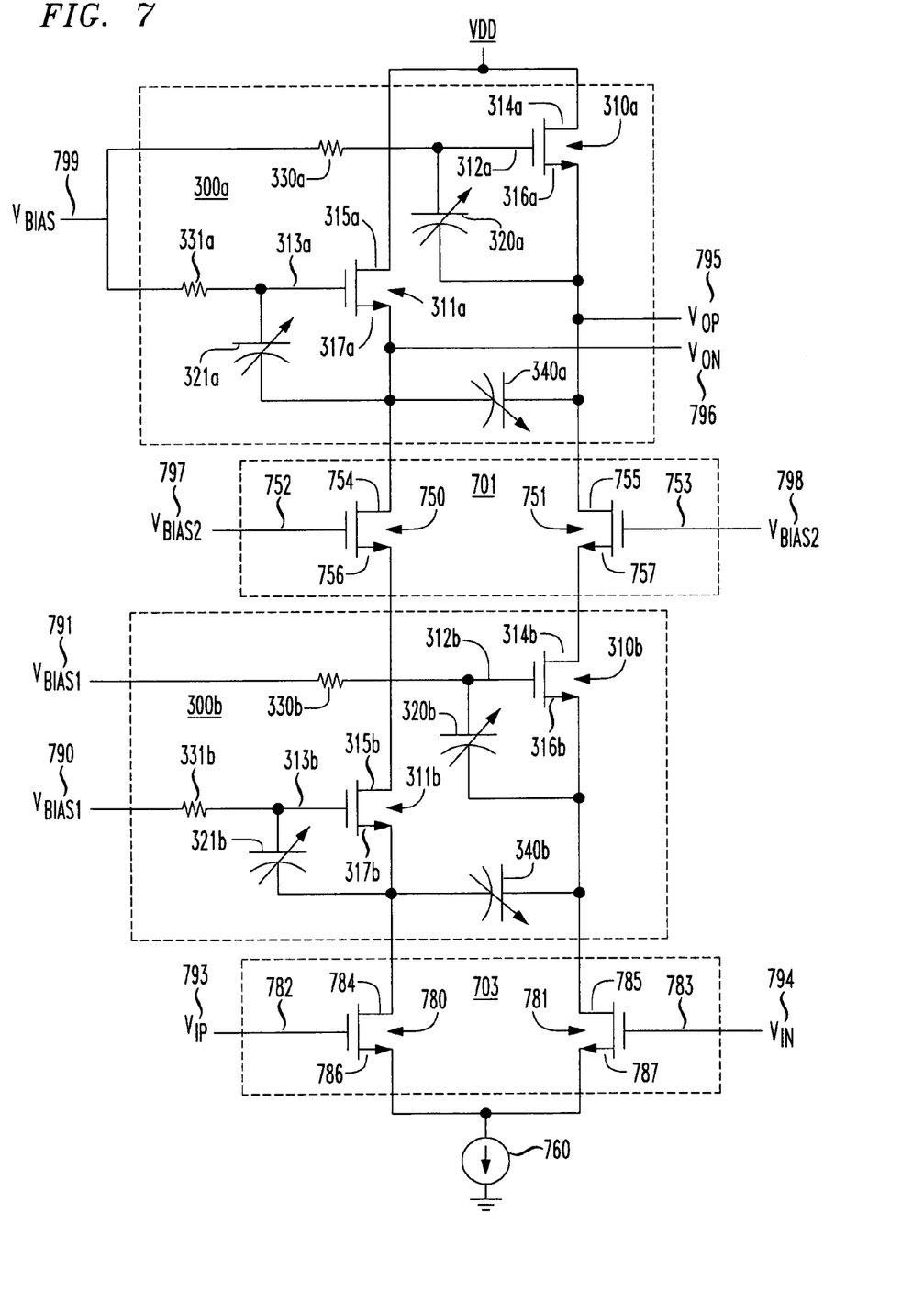

Turning to FIG. 7, a cascoded filter 700 including two differential filter sections 300 in accordance with one or more embodiments of the present invention is shown. Filter 700 includes a differential input stage 703 that is electrically coupled to a first differential filter stage 300b. Differential filter stage 300b is electrically coupled to an common gate stage 701, and another differential filter stage 300a. Differential input stage 703 includes a transistor 780 with a gate 782, a drain 784 and a source 786; and a transistor 781 with a gate 783, a drain 785 and a source 787. A positive differential input (VIP) 793 is connected to gate 782 of transistor 780, and a negative differential input (VIN) 794 is connected to gate 783 of transistor 781. Differential input stage 703 is electrically coupled to differential filter section 300b by connecting source 317b of transistor 311b to drain 784 of transistor 780, and connecting source 316b of transistor 310b to drain 785 of transistor 781. Source 786 of transistor 780 and source 787 of transistor 781 are each electrically coupled to a current source 760.

Common gate stage 701 includes a transistor 750 with a gate 752, a drain 754 and a source 756; and a transistor 751 with a gate 753, a drain 755 and a source 757. A differential filter output including a positive output (VOP) 795 and a negative output (VON) 796 is provided, with VOP 795 electrically coupled to drain 755 of transistor 751 and VON 796 electrically coupled to drain 754 of transistor 750. Differential bias inputs 797, 798 are connected to respective gates 752, 753 of transistors 750, 751. In operation, common gate stage 701 operates to induce a voltage offset on differential outputs 795, 796.

Common gate stage 701 is electrically coupled to differential filter stage 300b by connecting source 756 of transistor 750 to drain 315b of transistor 311b, and connecting source 757 of transistor 751 to drain 314b of transistor 310b. Further, common gate stage 701 is electrically coupled to differential filter stage 300a by connecting drain 754 of transistor 750 to source 317a of transistor 311a, and connecting drain 755 of transistor 751 to drain 316a of transistor 310a. A single-ended bias 799 is applied to gate 312a of transistor 310a via resistor 330a, and to gate 313a of transistor 311a via resistor 331a.

As will be appreciated by one of ordinary skill in the art upon reading the disclosure provided herein, filters of varying sophistication can be achieved with one or more pairs of complex poles and using fewer components, less power, and reduced distortion for a given power dissipation when compared to current design approaches. For example, embodiments of the present invention compare favorably with filters built with a single operational amplifier as fewer components and power are required using embodiments of the present invention and similar technology. Further, various embodiments of the present invention provide an increased ability to adjust the Q-factor and eliminate or reduce the effects of a parasitic zero when compared with single source follower designs. Yet further, in some cases, filters may be achieved in accordance with embodiments of the present invention that exhibit reduced electrical noise due to the reduced number of amplifiers when compared with other approaches.

It should be noted that not all possible embodiments have been discussed herein, but that other filters may be achievable using the filter sections as described herein in relation to FIGS. 2 and 3. For example, a design using more than two differential filter sections may be cascoded to create a larger number of complex poles. Alternatively, in filters 400, 500, 600 and 700 differential filter sections 300, 301 may be used interchangeably. Further, depending upon the embodiment, either the gate or the source may be used as a signal input for the filter. In the case where the source is used as an input and the drain as an output, a parasitic zero is eliminated from the filter operation. Based on the disclosure provided herein, one of ordinary skill in the art will recognize a number of other filter designs that are achievable using the described filter sections.

In conclusion, the present invention provides novel systems, methods and arrangements for filtering electrical signals. While detailed descriptions of one or more embodiments of the invention have been given above, various alternatives, modifications, and equivalents will be apparent to those skilled in the art without varying from the spirit of the invention. For example, based on the disclosure provided herein, one of ordinary skill in the art will recognize a variety of circuits that may be designed using the filter sections disclosed herein. Further, based on the disclosure provided herein, one of ordinary skill in the art will recognize that embodiments of the present invention may be implemented as a single integrated circuit such as, for example, an application specific integrated circuit (ASIC); across two or more integrated circuits formed as a multi-chip module; using discrete devices disposed on a circuit board; or some combination thereof. Therefore, the above description should not be taken as limiting the scope of the invention, which is defined by the appended claims.

What is claimed is:

1. A differential, tunable circuit operable to create a pair of complex poles the circuit comprising:
   a first transistor with a gate, a source and a drain;
   a first tuning capacitor wherein the first tuning capacitor is electrically coupled between the gate of the first transistor and the source of the first transistor;
   a first resistor, wherein the first resistor is electrically coupled to the gate of the first transistor, and wherein a first input is electrically coupled to the gate of the first transistor via the first resistor;
   a second transistor with a gate, a source and a drain;
   a second tuning capacitor, wherein the second tuning capacitor is electrically coupled between the gate of the second transistor and the source of the second transistor; and
   a second resistor, wherein the second resistor is electrically coupled to the gate of the second transistor, and wherein a second input is electrically coupled to the gate of the second transistor via the second resistor.

2. The circuit of claim 1, wherein the first input is a first bias input, wherein the second input is a second bias input, wherein a differential signal input is applied across the source of the first transistor and the source of the second transistor, and wherein a differential output of the differential circuit is electrically coupled to nodes selected from a group consisting of: the source of the first transistor and the source of the second transistor; and the drain of the first transistor and the drain of the second transistor.

3. The circuit of claim 1, wherein the differential circuit further comprises:
   a third capacitor electrically coupled between the source of the first transistor and the source of the second transistor.

4. The circuit of claim 3, wherein the first transistor is a first filter transistor, wherein the second transistor is a second filter transistor, and wherein the differential circuit further comprises:
   a first common gate transistor with a gate, a drain and a source;
   a second common gate transistor with a gate, a drain and a source;
   a first differential input transistor with a gate, a drain and a source;
   a second differential input transistor with a gate, a drain and a source;
   a third filter transistor with a gate, a drain and a source;
   a third tuning capacitor, wherein the third tuning capacitor is electrically coupled between the gate of the third filter transistor and the source of the third filter transistor;
   a fourth filter transistor with a gate, a drain and a source;
   a fourth tuning capacitor, wherein the fourth tuning capacitor is electrically coupled between the gate of the fourth filter transistor and the source of the fourth filter transistor;
   a first differential input electrically coupled to the gate of the first differential input transistor;
   a second differential input electrically coupled to the gate of the second differential input transistor;
   wherein the drain of the first differential input transistor is electrically coupled to the source of the third filter transistor wherein the drain of the second differential input transistor is electrically coupled to the source of the fourth filter transistor;
   wherein the drain of the third filter transistor is electrically coupled to the source of the first common gate transistor;
   wherein the drain of the fourth filter transistor is electrically coupled to the source of the second common gate transistor;
   wherein the drain of the first common gate transistor is electrically coupled to the source of the first filter transistor;
   wherein the drain of the second common gate transistor is electrically coupled to the source of the second filter transistor; and wherein the differential circuit is operable to create two pairs of complex poles.

5. The circuit of claim 1, wherein the differential circuit further comprises:
   a third capacitor, wherein the third capacitor is electrically coupled to the source of the first transistor; and
   a fourth capacitor, wherein the fourth capacitor is electrically coupled to the source of the second transistor.

6. The circuit of claim 1, wherein the differential circuit further comprises:
   a first output electrically coupled to the source of the first transistor;
   a second output electrically coupled to the source of the second transistor; and
   a nullator electrically coupled between the source of the first transistor and the source of the second transistor.

7. The circuit of claim 6, wherein the nullator includes:
   a third transistor with a gate, a source and a drain;
   a fourth transistor with a gate, a source and a drain;
   wherein the drain of the third transistor is electrically coupled to the gate of the fourth transistor, wherein the drain of the fourth transistor is electrically coupled to the gate of the third transistor; and
   wherein the nullator is electrically coupled between the source of the first transistor and the source of the second transistor by electrically coupling the drain of the third transistor with the source of the first transistor and electrically coupling the drain of the fourth transistor to the source of the second transistor.

8. The circuit of claim 1, wherein the differential circuit further comprises:
   a first cross-coupling capacitor, wherein the first cross-coupling capacitor is electrically coupled between the gate of the first transistor and the second input; and
   a second cross-coupling capacitor, wherein the second cross-coupling capacitor is electrically coupled between the gate of the second transistor and the first input.

9. The circuit of claim 1, wherein the first transistor is a first filter transistor, wherein the second transistor is a second filter transistor, and wherein the differential circuit further comprises:
   a first load stage transistor with a gate, a source and a drain;
   a second load stage transistor with a gate, a source and a drain;
   wherein the drain of the first load stage transistor is electrically coupled to a power source, wherein the gate of the first load stage transistor is electrically coupled to a first bias input, wherein the source of the first load stage transistor is electrically coupled to the drain of the first filter transistor, and wherein a first output of the circuit is electrically coupled to the drain of the first filter transistor; and
   wherein the drain of the second load stage transistor is electrically coupled to the power source, wherein the gate of the second load stage transistor is electrically coupled to a second bias input, wherein the source of the second load stage transistor is electrically coupled to the drain of the second filter transistor, and wherein a second output of the circuit is electrically coupled to the drain of the second filter transistor.

10. The circuit of claim 9, wherein the differential circuit further comprises:
    a first differential input transistor with a gate, a drain and a source;
    a second differential input transistor with a gate, a drain and a source;
    a first differential input electrically coupled to the gate of the first differential input transistor;
    a second differential input electrically coupled to the gate of the second differential input transistor;
    wherein the drain of the first differential input transistor is electrically coupled to the source of the first filter transistor; and wherein the drain of the second differential input transistor is electrically coupled to the source of the second filter transistor.

11. The circuit of claim 1, wherein the first transistor is a first filter transistor, wherein the second transistor is a second filter transistor, and wherein the differential circuit further comprises:
a first differential input transistor with a gate, a drain and a source;
a second differential input transistor with a gate, a drain and a source;
a first differential input electrically coupled to the gate of the first differential input transistor;
a second differential input electrically coupled to the gate of the second differential input transistor;
wherein the drain of the first differential input transistor is electrically coupled to the source of the first filter transistor; and
wherein the drain of the second differential input transistor is electrically coupled to the source of the second filter transistor.

12. The circuit of claim 1, wherein a differential output of the differential circuit is electrically coupled to nodes selected from a group consisting of: the source of the first transistor and the source of the second transistor; and the drain of the first transistor and the drain of the second transistor.

13. A differential electrical filter operable to create a pair of complex poles, the differential electrical filter consisting essentially of:
a first transistor with a gate, a source and a drain;
a second transistor with a gate, a source and a drain;
a first tuning capacitor, wherein the first tuning capacitor is electrically coupled between the gate of the first transistor and the source of the first transistor;
a second tuning capacitor, wherein the second tuning capacitor is electrically coupled between the gate of the second transistor and the source of the second transistor;
a first resistor, wherein the first resistor is electrically coupled to the gate of the first transistor, and wherein a first differential input is electrically coupled to the gate of the first transistor via the first resistor; and
a second resistor, wherein the second resistor is electrically coupled to the gate of the second transistor, and wherein a second differential input is electrically coupled to the gate of the second transistor via the second resistor.

14. The differential electrical filter of claim 13, wherein the differential electrical filter circuit includes a first differential output electrically coupled to the source of the first transistor; and wherein the differential electrical filter circuit includes a second differential output electrically coupled to the source of the second transistor.

15. The differential electrical filter of claim 13, wherein the differential electrical filter circuit includes a first differential output electrically coupled to the drain of the first transistor; and wherein the differential electrical filter circuit includes a second differential output electrically coupled to the drain of the second transistor.

16. A cascoded filter, wherein the cascoded filter comprises:
a first filter stage, wherein the second stage filter is operable to create a first pair of complex poles, and wherein the first filter stage includes:
a first transistor with a gate, a source and a drain;
a second transistor with a gate, a source and a drain;
a first tuning capacitor, wherein the first tuning capacitor is electrically coupled between the gate of the first transistor and the source of the first transistor;
a second tuning capacitor, wherein the second tuning capacitor is electrically coupled between the gate of the second transistor and the source of the second transistor;
a first resistor, wherein the first resistor is electrically coupled to the gate of the first transistor; and a second resistor, wherein the second resistor is electrically coupled to the gate of the second transistor;
a second filter stage, wherein the second stage filter is operable to create a second pair of complex poles, and wherein the second filter stage includes:
a third transistor with a gate, a source and a drain;
a fourth transistor with a gate, a source and a drain;
a third tuning capacitor, wherein the third tuning capacitor is electrically coupled between the gate of the third transistor and the source of the third transistor;
a fourth tuning capacitor, wherein the fourth tuning capacitor is electrically coupled between the gate of the fourth transistor and the source of the fourth transistor;
a third resistor, wherein the first resistor is electrically coupled to the gate of the third transistor; and a fourth resistor, wherein the fourth resistor is electrically coupled to the gate of the fourth transistor; and
wherein the first stage is electrically coupled to the second stage.

17. The cascoded filter of claim 16, wherein the cascoded filter further comprises:
a differential input stage, wherein the differential input stage is electrically coupled to the first filter stage, and wherein the differential input stage includes:
a fifth transistor with a gate, a source and a drain;
a sixth transistor with a gate, a source and a drain;
wherein the gate of the fifth transistor is electrically coupled to a first differential input; and wherein the gate of the sixth transistor is electrically coupled to a second differential input.

18. The cascoded filter of claim 17, wherein the cascoded filter further comprises:
an common gate stage, wherein the common gate stage is electrically coupled to the first filter stage and the second filter stage, and wherein the common gate stage includes:
a seventh transistor with a gate, a source and a drain; an eighth transistor with a gate, a source and a drain;
wherein the gate of the seventh transistor is electrically coupled to a first bias input; and
wherein the gate of the eighth transistor is electrically coupled to a second bias input.

19. The cascoded filter of claim 18, wherein the cascoded filter further comprises:
a current source, wherein the current source is electrically coupled to the differential input stage.

20. The cascoded filter of claim 18, wherein a differential output is taken from the source of the third transistor and the source of the fourth transistor.

* * * * *